(12) United States Patent
Chang et al.

(10) Patent No.: US 8,410,516 B2
(45) Date of Patent: Apr. 2, 2013

(54) LIGHT EMITTING DIODE PACKAGE HAVING INTERCONNECTION STRUCTURES

(75) Inventors: Chao-Hsiung Chang, Taiwan (TW); Pi-Chiang Hu, Taiwan (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 109 days.

(21) Appl. No.: 13/082,406

(22) Filed: Apr. 8, 2011

(65) Prior Publication Data

US 2012/0061692 A1 Mar. 15, 2012

(30) Foreign Application Priority Data

Sep. 10, 2010 (CN) .......................... 2010 1 0278276

(51) Int. Cl.
*H01L 33/00* (2010.01)
*H01L 29/207* (2006.01)
*H01L 29/18* (2006.01)
*H01L 23/00* (2006.01)

(52) U.S. Cl. ............... 257/99; 257/88; 257/93; 257/692; 257/700; 257/E33.056; 257/E33.057; 257/E33.066

(58) Field of Classification Search .................... 257/88, 257/93, 99, 692, 700, E33.056, E33.057
See application file for complete search history.

(56) References Cited

U.S. PATENT DOCUMENTS

| 7,176,503 | B2 * | 2/2007 | Kim et al. ...................... 257/100 |
| 7,709,946 | B2 * | 5/2010 | Ryu et al. ...................... 257/692 |
| 8,030,670 | B2 * | 10/2011 | Kim et al. ........................ 257/88 |
| 2010/0117099 | A1 * | 5/2010 | Leung ............................ 257/88 |
| 2010/0277919 | A1 * | 11/2010 | Okada et al. ............. 362/249.02 |
| 2011/0186875 | A1 * | 8/2011 | Egoshi et al. .................... 257/89 |
| 2012/0223343 | A1 * | 9/2012 | Kang et al. ...................... 257/88 |

* cited by examiner

*Primary Examiner* — Matthew W. Such
*Assistant Examiner* — Jeremy Joy
(74) *Attorney, Agent, or Firm* — Altis Law Group, Inc.

(57) ABSTRACT

A light emitting diode (LED) package includes a substrate, a first LED chip and a second LED chip. The substrate includes first to fourth electrodes, and an interconnection electrode. A mounting area is defined at center of a top surface of the substrate. The first to fourth electrodes are respectively in four corners of the substrate out of the mounting area. The first interconnection electrode is embedded in the substrate to electrically connect the first and the third electrodes. The first LED chip and the second LED chip are arranged in the mounting area. Each LED chip includes an anode pad and a cathode pad. The first to fourth electrodes are respectively connected to the four pads of the first and the second LED chips via a plurality of metal wires, and no metal wire connection is formed between the first and the second LED chips.

10 Claims, 10 Drawing Sheets

LIGHT EMITTING DIODE PACKAGE HAVING INTERCONNECTION STRUCTURES

BACKGROUND

1. Technical Field

The present disclosure relates to a light emitting diode (LED) package, and more particularly, to an LED package having an interconnection structure.

2. Description of Related Art

Referring to FIG. 8 and FIG. 9, a typical LED package 1 includes a substrate 10, a first LED chip 11, a second LED chip 12, a number of metal wires 13, and a protective layer 14. The metal wires 13 include a first metal wire 13a, a second metal wire 13b, and a third metal wire 13c. Each LED chip 11 or 12 includes an anode pad and a cathode pad (not labeled). The substrate 10 includes a mounting area 109, a first electrode 101, and a second electrode 102. The mounting area 109 is defined at a central region of the substrate 10. The first electrode 101 and the second electrode 102 are correspondingly arranged at opposite sides of the mounting area 109. The first LED chip 11 and the second LED chip 12 are located in the mounting area 109 of the substrate 10. The anode pad of the first LED chip 11 connects to the first electrode 101 via the first metal wire 13a. The cathode pad of the first LED chip 11 connects to the anode pad of the second LED chip 12 via the second metal wire 13b. The cathode pad of the second LED chip 12 connects to the second electrode 102 via the third metal wire 13c. The protective layer 14 covers the substrate 10, the first LED chip 11, the second LED chip 12, and the metal wires 13. In such manner, the first LED chip 11 and the second LED chip 12 are electrically connected in series between the first electrode 101 and the second electrode 102, as shown in FIG. 10.

However, when the pads of the first LED chip 11 and the second LED chip 12 are connected via the metal wires 13b, the first and the second LED chips 11, 12 may be damaged due to electrostatic discharge thereof, thereby reducing the reliability of the LED package 1. Moreover, because the pads of the first and the second LED chips 11, 12 are higher than the first electrode 101 and the second electrode 102 on the substrate 10 according to the metal wire bonding technology, the second metal wire 13b connecting between the pads of the first and the second LED chips 11, 12 needs to be higher than the first and the third metal wires 13a and 13c, as shown in FIG. 9 (i.e., a height difference H generally between tops of the second metal wire 13b and the first and third metal wires 13a, 13c), thereby increasing a thickness of the LED package 1.

Therefore, an LED package is desired to overcome the above-described shortcomings.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

DETAILED DESCRIPTION

Reference will now be made to the drawings to describe various inventive embodiments of the present disclosure in detail, wherein like numerals refer to like units throughout.

Figure 1:
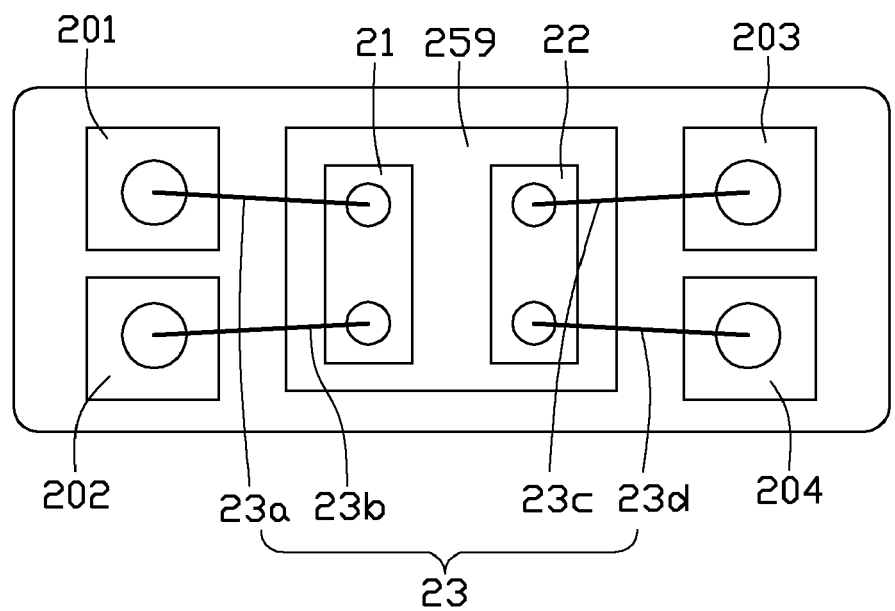
FIG. 1. is a schematic, top view of an LED package according to a first embodiment of the present disclosure, the LED package including a substrate.
Figure 2:
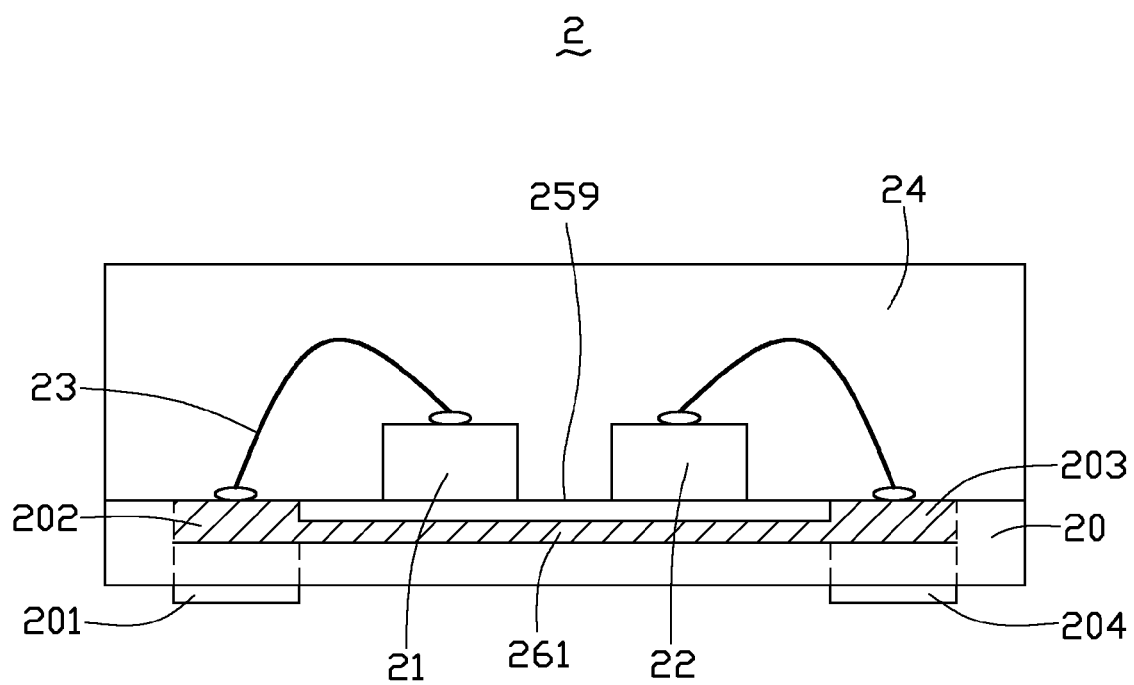
FIG. 2. is a schematic, cross-sectional view of the LED package of FIG. 1.

Referring to FIG. 1 and FIG. 2, an LED package 2 according to a first embodiment of the present disclosure includes a substrate 20, a first LED chip 21, a second LED chip 22, a number of metal wires 23, and a protective layer 24. Each LED chip 21 or 22 includes an anode pad and a cathode pad (not labeled). The metal wires 23 include a first metal wire 23a, a second metal wire 23b, a third metal wire 23c, and a fourth metal wire 23d.

The substrate 20 is rectangular and includes a first electrode 201, a second electrode 202, a third electrode 203, a fourth electrode 204, an interconnection electrode 261, and a mounting area 259. The mounting area 259 is a square region defined at center of a top surface of the substrate 20. The first to fourth electrodes 201~204 are correspondingly arranged adjacent four corners of the substrate 20 outside the mounting area 259. The first electrode 201 and the fourth electrode 204 extend downwardly from the top surface of the substrate 20 to a position beyond a bottom surface of the substrate 20. Top ends of the second electrode 202 and the third electrode 203 are exposed from the top surface of the substrate 20. The interconnection electrode 261 is embedded in the substrate 20 and configured for electrically interconnecting the second electrode 202 and the third electrode 203.

Figure 3:
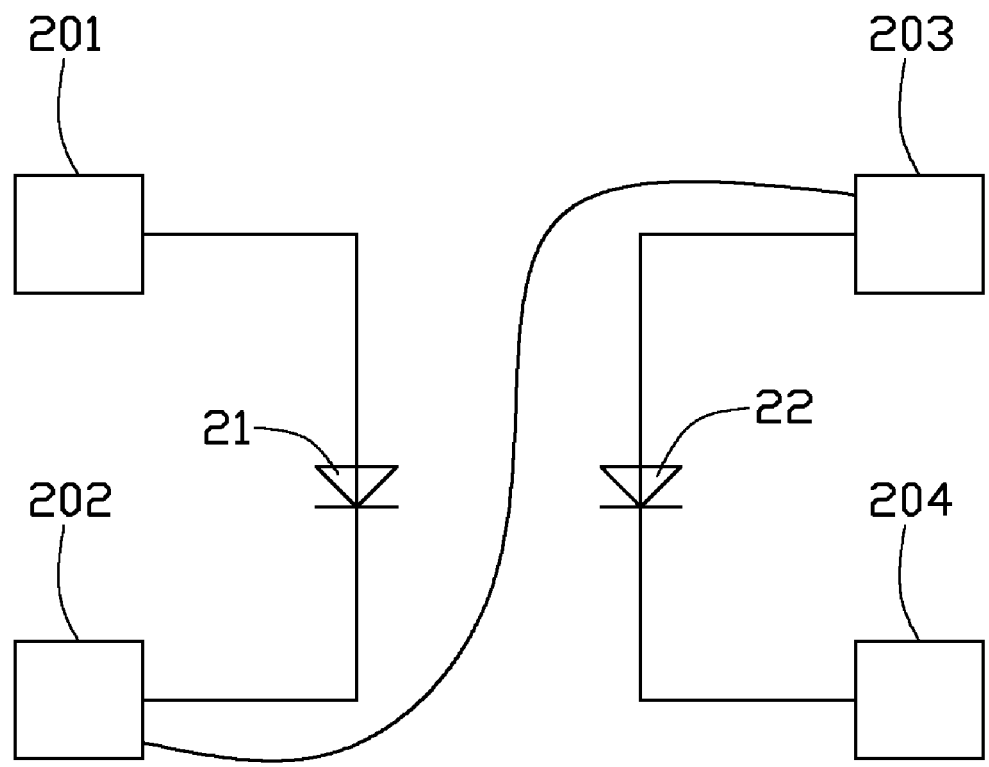
FIG. 3 is an equivalent circuit diagram of the LED package of FIG. 1.

The first LED chip 21 and the second LED chip 22 are mounted on the mounting area 259 as shown in FIG. 1. The anode pad of the first LED chip 21 connects to the first electrode 201 via the first metal wire 23a. The cathode pad of the first LED chip 21 connects to the second electrode 202 via the second metal wire 23b. The anode pad of the second LED chip 22 connects to the third electrode 203 via the third metal wire 23c. The cathode pad of the second LED chip 22 connects to the fourth electrode 204 via the fourth metal wire 23d. The protective layer 24 covers the first LED chip 21, the second LED chip 22, the metal wires 23 and the substrate 20. As an equivalent circuit diagram shown in FIG. 3, the first LED chip 21 and the second LED chip 22 of the LED package 2 are connected in series between the first electrode 201 and the fourth electrode 204.

Figure 4:
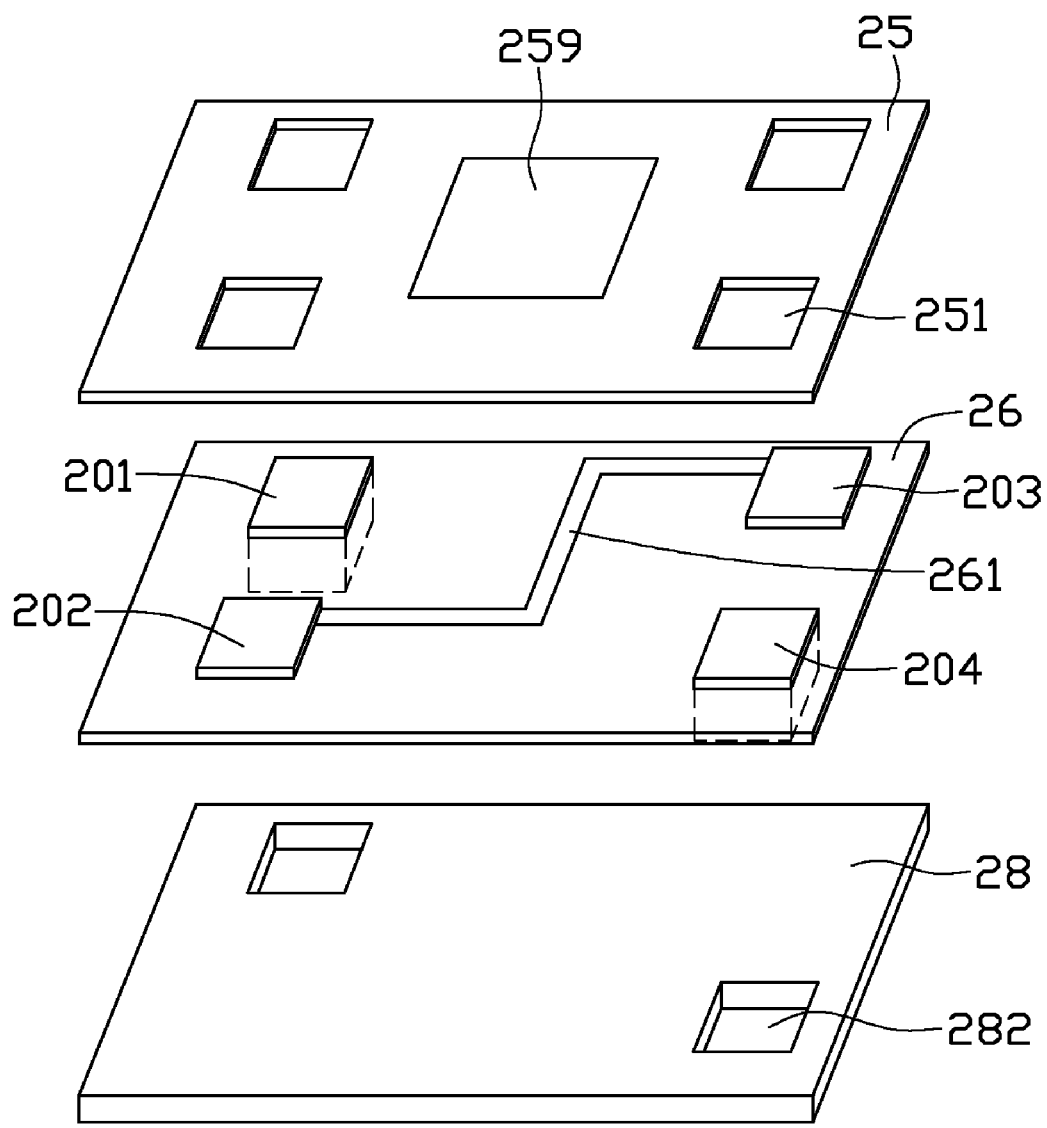
FIG. 4 is a schematic, isometric, exploded view of the substrate of the LED package of FIG. 1.

Referring to FIG. 4, the substrate 20 further includes a mounting base 25, a layout layer 26, and a supporting base 28. In this embodiment, the mounting base 25 and the supporting base 28 are made of electrically insulating materials such as ceramics. The layout layer 26 is sandwiched between the mounting base 25 and the supporting base 28 and configured in a rectangular shape corresponding to that of each of the mounting base 25 and the supporting base 28.

The mounting base 25 includes four mounting holes 251 arranged in its four corners. The mounting area 259 is defined at center of a top surface of the mounting base 25 and surrounded by the four mounting holes 251.

The first to fourth electrodes 201~204, and the interconnection electrode 261 are formed on the layout layer 26. The first to fourth electrodes 201~204 are correspondingly arranged in four corners of the layout layer 26 and located corresponding to the mounting holes 251. The first electrode 201 and the fourth electrode 204 are located at two opposite diagonal corners and the second electrode 202 and the third electrode 203 are located at other two opposite diagonal corners of the layout layer 26. The interconnection electrode 261 electrically connects the second electrode 202 to the third electrode 203.

The supporting base 28 includes two exposing holes 282 arranged at its two opposite diagonal corners corresponding to the first electrode 201 and the fourth electrode 204.

In assembly, the mounting base 25 is attached to the layout layer 26 in such manner that a bottom surface of the mounting base 25 aligns with and contacts a top surface of the layout layer 26 to make the first to fourth electrodes 201~204 correspondingly pass through the mounting holes 251. Therefore, ends of the first to fourth electrodes 201~204 are exposed at the top surface of the mounting base 25 for connecting to the pads of the first and the second LED chips 21, 22 via the metal wires 23. In this embodiment, top surfaces of the first to fourth electrodes 201~204 are coplanar to the top surface of the mounting base 25.

Then, the layout layer 26 together with the mounting base 25 is attached to the supporting base 28 in such manner that a bottom surface of the layout base 26 aligns with and contacts a top surface of the supporting base 28. Therefore, the first electrode 201 and the fourth electrode 204 correspondingly pass through the exposing holes 282 and protrude from a bottom surface of the supporting base 28. The protruded first electrode 201 and fourth electrode 204 function as connecting terminals of the LED package 2 and electrically connect with an external circuit (not shown).

After that, the mounting base 25, the layout layer 26, and the supporting base 28 are integrated together into a single piece using low temperature cofired ceramics (LTCC) technology.

Figure 8:
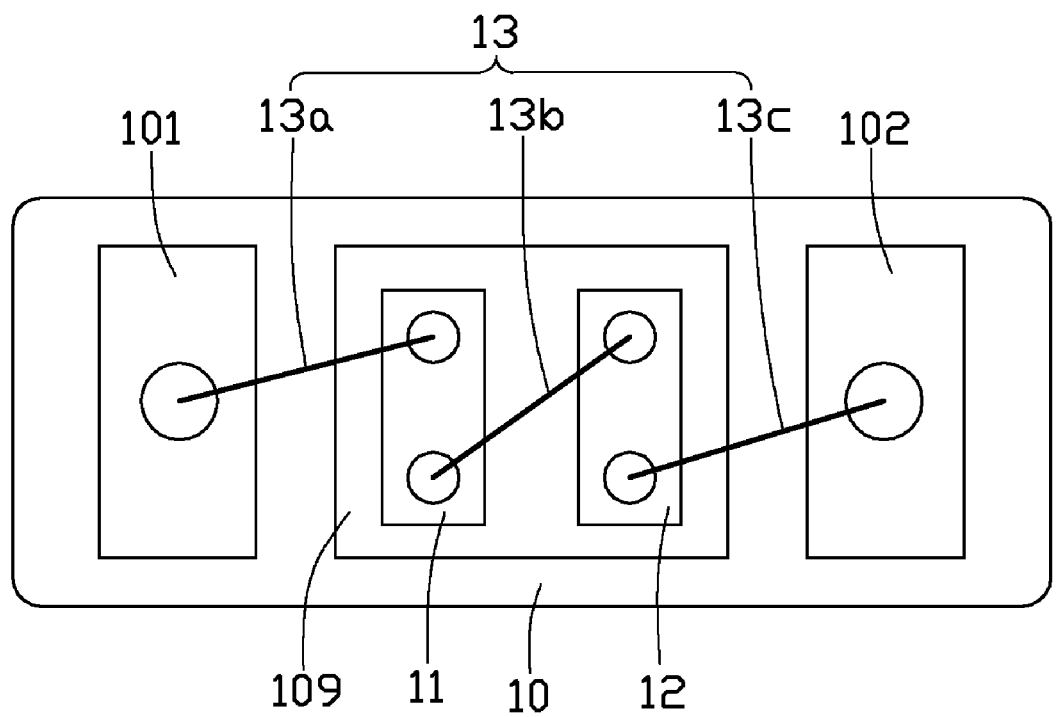
FIG. 8 is a schematic, top view of a conventional LED package.
Figure 9:
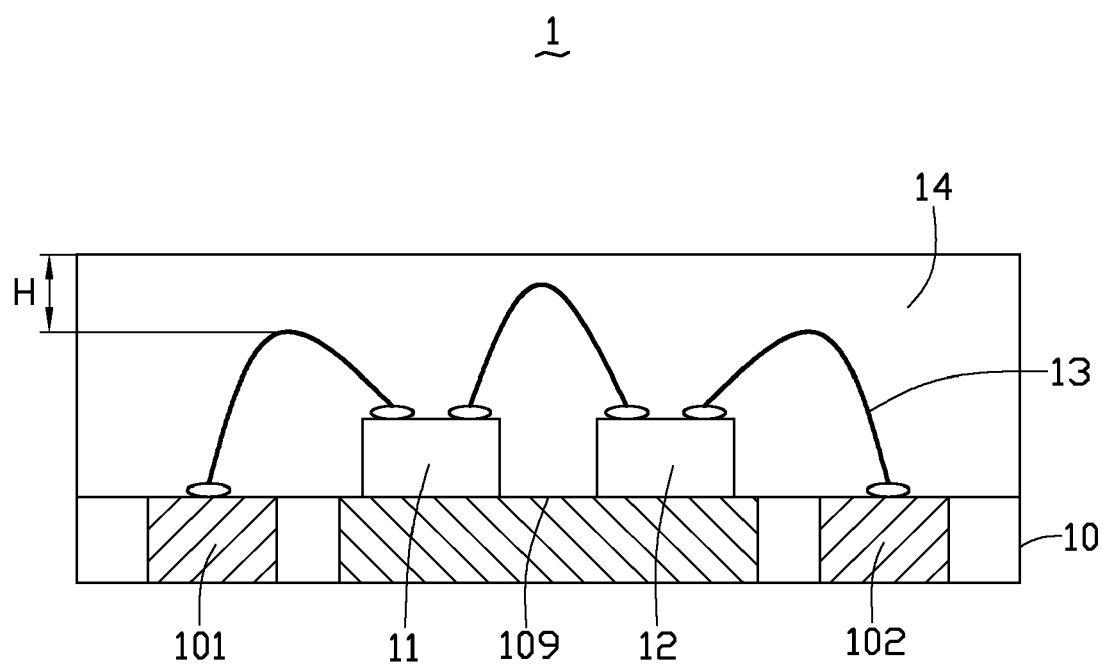
FIG. 9 is a schematic, cross-sectional view of the LED package of FIG. 8.
Figure 10:
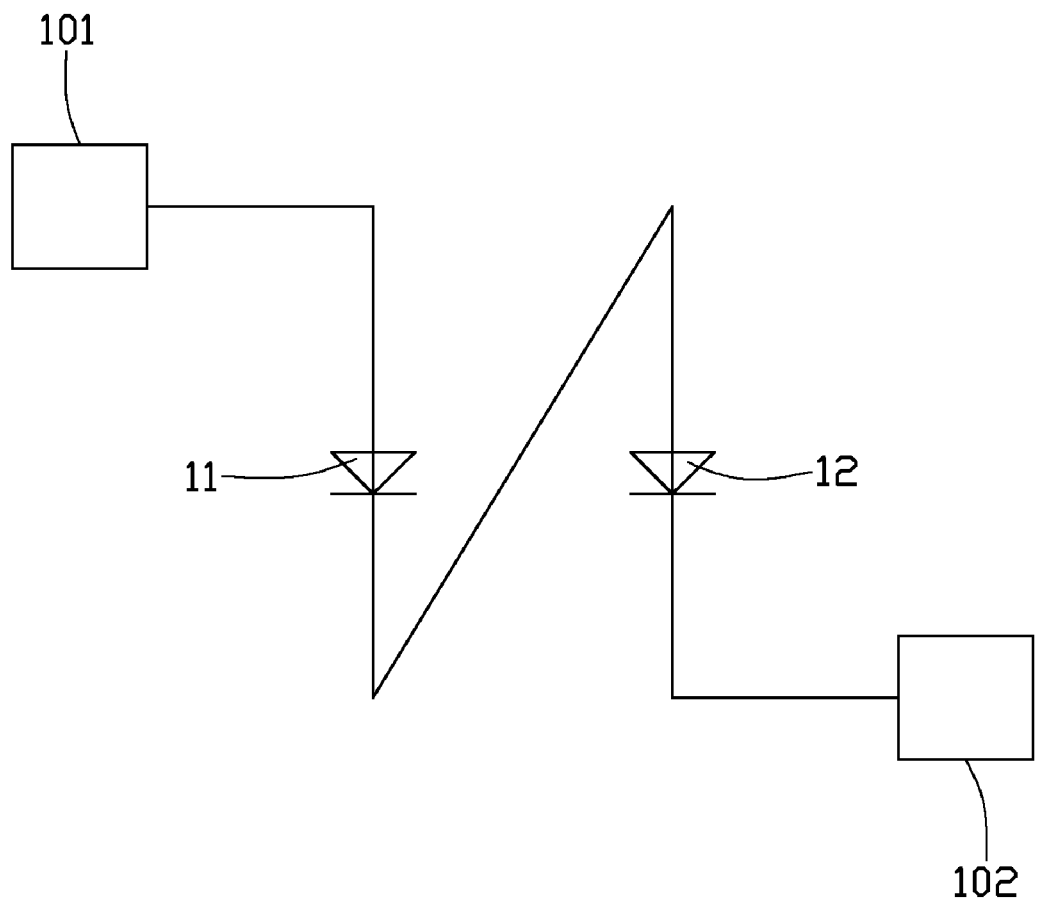
FIG. 10 is an equivalent circuit diagram of the LED package of FIG. 8.

Because the pads of the first and the second LED chip 21, 22 are directly connected to corresponding electrodes 201~204, and there has no metal wires directly connected between any two pads of the first and the second LED chips 21, 22, the LED package 2 can be manufactured with a low profile and an improved reliability than the related LED package 1 shown in FIGS. 8-10 of the present disclosure.

Figure 5:
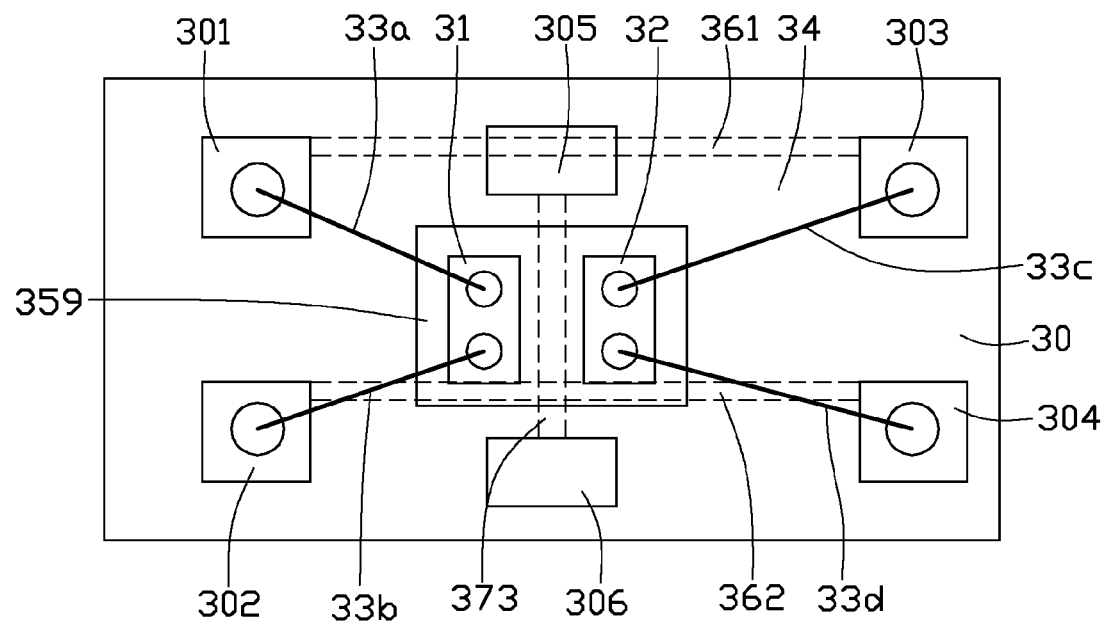
FIG. 5 is a schematic, top view of an LED package according to a second embodiment of the present disclosure, the LED package including a substrate.
Figure 6:
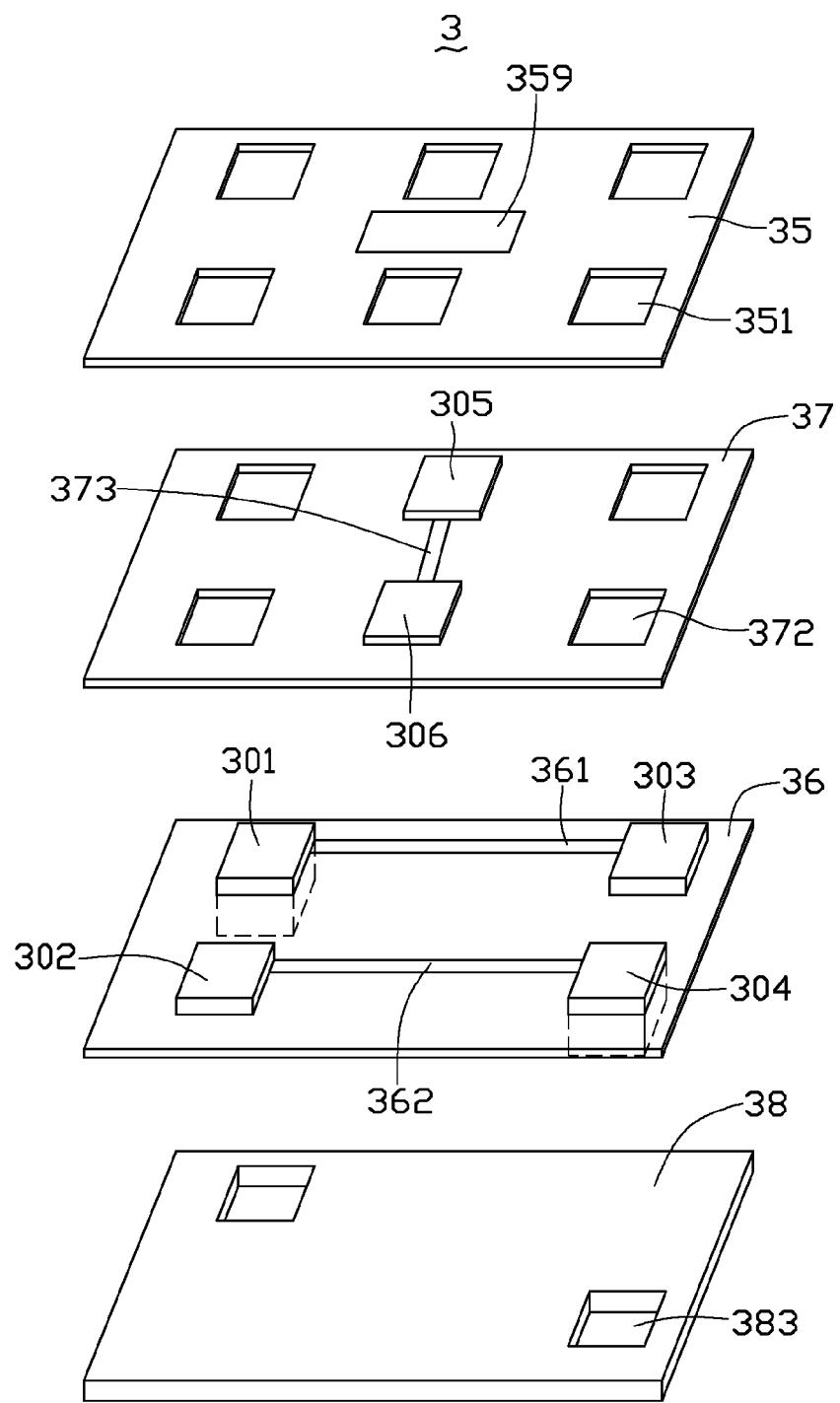
FIG. 6 is a schematic, isometric, exploded view of the substrate of the LED package of FIG. 5.

Referring to FIGS. 5 to 6, an LED package 3 according to a second embodiment of the present disclosure includes a rectangular substrate 30, a first LED chip 31, a second LED chip 32, a plurality of metal wires 33a~33f, and a protective layer 34. Each LED chip 31 or 32 includes an anode pad and a cathode pad (not labeled). The metal wires 33a~33f hereafter name as first to sixth metal wires 33a~33f.

As shown in FIG. 6, the substrate 30 includes a mounting base 35, a first layout layer 36, a second layout layer 37, and a supporting base 38. In this embodiment, the mounting base 35 and the supporting base 38 are made of electrically insulating materials such as ceramics.

The mounting base 35 includes six mounting holes 351, four of which are positioned in four corners of the mounting base 35 and the other two of which are positioned at two opposite sides of the mounting base 35. A rectangular area which is surrounded by the mounting holes 351 and positioned at center of a top surface of the mounting base 35 is defined as a mounting area 359.

The first layout layer 36 includes first to fourth electrodes 301~304, a first interconnection electrode 361, and a second interconnection electrode 362. The first to fourth electrodes 301~304 are positioned in four corners of the first layout layer 36 corresponding to the mounting holes 351 in the corners of the mounting base 35.

The first electrode 301 and the fourth electrode 304 are positioned at two opposite diagonal corners. The second electrode 302 and the third electrode 303 are positioned at the other two opposite diagonal corners of the first layout layer 36. The first interconnection electrode 361 connects the first electrode 301 to the third electrode 303. The second interconnection electrode 362 connects the second electrode 302 to the fourth electrode 304. In this embodiment, the first interconnection electrode 361 and the second interconnection electrode 362 are strip-shaped and parallel to each other.

The second layout layer 37 is sandwiched between the first layout layer 36 and the mounting base 35 and includes a fifth electrode 305, a sixth electrode 306, a third interconnection electrode 373 formed thereon. Four through holes 372 are defined in four corners of the second layout layer 37 corresponding to the first to fourth electrodes 301~304. The fifth and the sixth electrodes 305, 306 are arranged corresponding to the two mounting holes 351 positioned at opposite sides of the mounting base 35. In other words, the fifth and the sixth electrodes 305, 306 are positioned at two opposite sides of the mounting area 359 corresponding to the mounting holes 351 at opposite sides of the mounting base 35. The third interconnection electrode 373 electrically connects the fifth and the sixth electrodes 305, 306. In this embodiment, the third interconnection electrode 373 is strip-shaped and electrically insulated from and perpendicular to the first and the second interconnection electrodes 361, 362.

The supporting base 38 includes two exposing holes 383 which are located at two opposite diagonal corners of the supporting base 38 corresponding to the first electrode 301 and the fourth electrode 304.

In assembly, the mounting base 35 is attached to the second layout layer 37 in such manner that a bottom surface of the mounting base 35 aligns with and contacts a top surface of the second layout layer 37. Therefore, the fifth electrode 305 and the sixth electrode 306 pass through corresponding mounting holes 351 at two opposite sides of the mounting base 35 to be exposed from the top surface of the mounting base 35.

After that, the first layout layer 36 is attached to the second layout layer 37 in such manner that a top surface of the first layout layer 36 aligns with and contacts a bottom surface of the second layout layer 37. Therefore, the first to fourth electrodes 301~304 pass through corresponding mounting holes 351 at four corners of the mounting base 35 via the through holes 372 to expose from the top surface of the mounting base 35. In this embodiment, the first to sixth electrodes 301~306 have top surfaces coplanar with the top surface of the mounting base 35.

Then, the supporting base 38 is attached to the first layout layer 36 to make the first electrode 301 and the fourth electrode 304 pass through the exposing holes 383 and protrude from a bottom surface of the supporting base 38. The exposed parts of first electrode 301 and the fourth electrode 304 are defined as connecting terminals of the LED package 3 for connecting an external circuit.

Finally, the mounting base 35, the first layout layer 36, the second layout layer 37, and the supporting base 38 are integrated together into a single piece, using LTCC technology. Therefore, the first interconnection electrode 316 is embedded in the substrate 30 to electrically connect the first and the third electrodes 301, 303. The second interconnection electrode 362 is embedded in the substrate 30 to electrically connect the second and the fourth electrodes 302, 304. The third interconnection electrode 373 is embedded in the substrate 30 to electrically connect the fifth and the sixth electrodes 305, 306.

In this embodiment, the first and the second LED chips 31, 32 are located in the mounting area 359 as shown in FIG. 5.

The anode pad and the cathode pad of the first LED chip 31 respectively connect to the first electrode 301 and the second electrode 302 correspondingly via the first and the second metal wires 33a, 33b. The anode pad and the cathode pad of the second LED chip 32 respectively connect to the third electrode 303 and the fourth electrode 304 correspondingly via the third and the fourth metal wires 33c, 33d. In other words, four pads of the LED chips 31, 32 respectively connect to the first to fourth electrodes 301~304 via the metal wires.

In such manner, the first LED chip 31 and the second LED chip 32 are electrically connected in parallel between the first electrode 301 and the fourth electrode 304.

Figure 7:
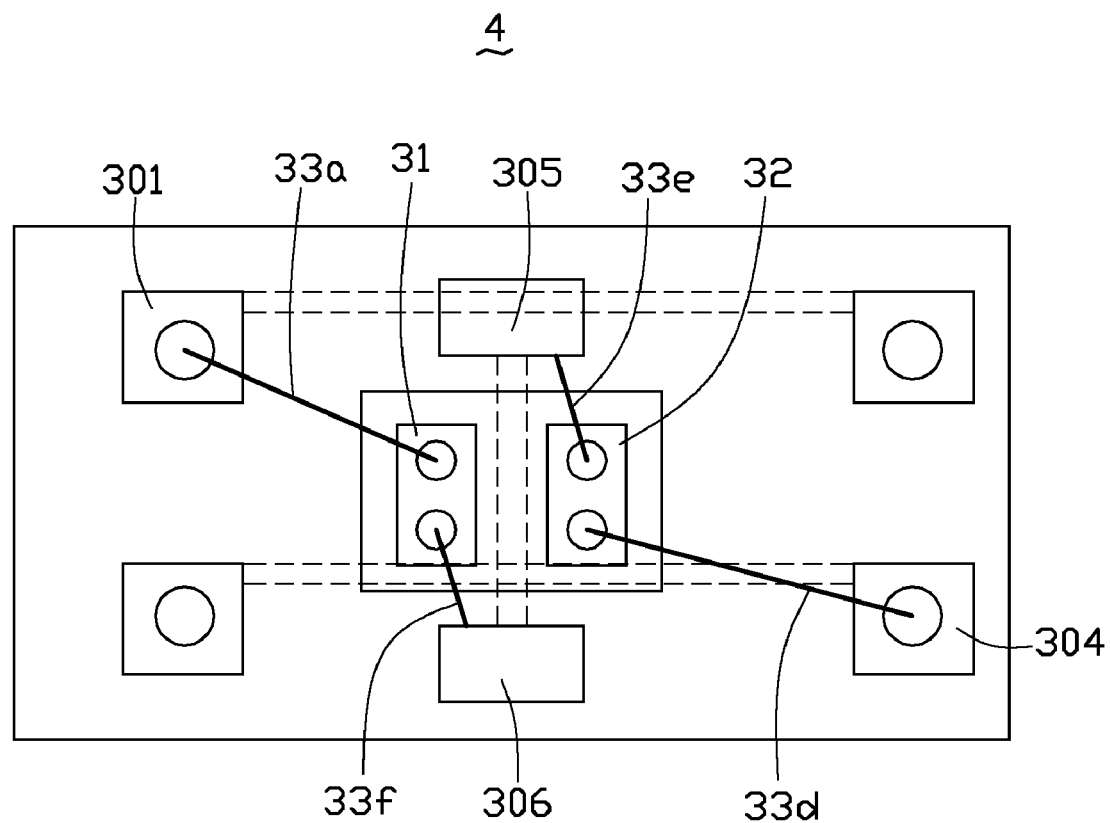
FIG. 7 is a schematic, top view of an LED package according to a third embodiment of the present disclosure.

Referring to FIG. 7, an LED package 4 according to a third embodiment of the present disclosure is similar to the LED package 3. The LED package 4 differs from the LED package 3 only in connection between the first LED chip 31 and the second LED chip 32. In this embodiment, the anode pad of the first LED chip 31 connects to the first electrode 301 via the first metal wire 33a. The cathode pad of the first LED chip 31 connects to the sixth electrode 306 via the sixth metal wire 33f. The anode pad of the second LED chip 32 connects to the fifth electrode 305 via the fifth metal wire 33e. The cathode pad of the second LED chip 32 connects to the fourth electrode 304 via the fourth metal wire 33d.

In such manner, the first LED chip 31 and the second LED chip 32 are electrically connected in series between the first electrode 301 and the fourth electrode 304.

It is to be understood, however, that even though numerous characteristics and advantages of certain inventive embodiments have been set out in the foregoing description, together with details of the structures and functions of the embodiments, the disclosure is illustrative only; and that changes may be made in detail, especially in matters of arrangement of parts within the principles of present invention to the full extent indicated by the broad general meaning of the terms in which the appended claims are expressed.

What is claimed is:

1. An LED package comprising:
a substrate comprising a first electrode, a second electrode, a third electrode, a fourth electrode, a fifth electrode, a sixth electrode, a first interconnection electrode, a second interconnection electrode, a third interconnection electrode, and a mounting area defined at center of a top surface of the substrate, the first to fourth electrodes respectively positioned in four corners of the substrate out of the mounting area and exposed from the top surface, the fifth and the sixth electrodes positioned at opposite sides of the substrate and exposed from the top surface, the first interconnection electrode embedded in the substrate to electrically connect the first and the third electrodes, the second interconnection electrode embedded in the substrate to electrically connect the second and the fourth electrodes, the third interconnection electrode embedded in the substrate to electrically connect the fifth and the sixth electrodes; and
a first LED chip and a second LED chip arranged in the mounting area, each LED chip comprising an anode pad and a cathode pad;
wherein four of the first to sixth electrodes are respectively connected to the four pads of the first and the second LED chips via a plurality of metal wires, and no metal wire connection is formed between the first and the second LED chips.

2. The LED package of claim 1, wherein the first to sixth electrodes have top surfaces coplanar to the top surface of the substrate.

3. The LED package of claim 2, wherein the first and the fourth electrode extend from the top surface to a bottom surface of the substrate and protrude from the bottom surface of the substrate.

4. The LED package of claim 1, wherein the first LED chip and the second LED chip are connected in series between the first and the fourth electrodes.

5. The LED package of claim 1, wherein the first LED chip and the second LED chip are connected in parallel between the first and the fourth electrodes.

6. The LED package of claim 1, wherein the first and the fourth electrode are located at two opposite diagonal corners of the substrate, and the second and the third electrodes are located at other two opposite diagonal corners of the substrate.

7. The LED package of claim 1, wherein the substrate further comprises a mounting base, a supporting base, a first layout layer, and a second layout layer,
the second and the first layout layer are sequentially sandwiched between the mounting base and the supporting base in that order;
the mounting base comprises sixth mounting holes corresponding to the first to sixth electrodes;
the supporting base comprises two exposing holes corresponding to the first and the fourth electrode;
the first layout layer comprises the first to fourth electrodes, the first interconnection electrode, and the second interconnection electrode formed thereon; and
the second layout layer comprises the fifth electrode, the sixth electrode, and the third interconnection electrode formed thereon.

8. The LED package of claim 7, wherein the second, the third, the fifth, and the sixth electrodes are only received in corresponding mounting holes, and top ends of the second, the third, the fifth, and the sixth electrodes are exposed from a top surface of the mounting base.

9. The LED package of claim 8, wherein the first and the fourth electrodes are received in both the through holes and corresponding mounting holes, top ends of the first and the fourth electrodes are exposed from the top surface of the mounting base, bottom ends of the first and the fourth electrodes are protruded from a bottom surface of the supporting base.

10. The LED package of claim 7, wherein the mounting base, the first layout layer, the second layout layer, and the supporting base are integrated together into a single piece using LTCC technology.

\* \* \* \* \*